United States Patent [19]

Murakami et al.

[11] Patent Number: 5,248,946
[45] Date of Patent: Sep. 28, 1993

[54] SYMMETRICAL DIFFERENTIAL AMPLIFIER CIRCUIT

[75] Inventors: Shuji Murakami; Atsushi Ohba; Kenji Anami, all of Hyogo, Japan

[73] Assignee: Mitsubishi Denki Kabushiki Kaisha, Tokyo, Japan

[21] Appl. No.: 805,144

[22] Filed: Dec. 11, 1991

[30] Foreign Application Priority Data

Dec. 13, 1990 [JP] Japan .................. 2-402057

[51] Int. Cl.⁵ ............................. H03F 3/45
[52] U.S. Cl. .................... 330/253; 307/530; 365/205
[58] Field of Search ........... 330/253, 288; 307/530; 365/190, 205

[56] References Cited

U.S. PATENT DOCUMENTS

| | | | |
|---|---|---|---|
| 4,103,345 | 7/1978 | Suzuki et al. | 307/238 |
| 4,136,292 | 1/1979 | Suzuki et al. | 330/253 |
| 4,479,202 | 10/1984 | Uchida | 307/530 |
| 4,509,147 | 4/1985 | Tanimura et al. | 365/205 |
| 4,633,192 | 12/1986 | Anami | 330/277 |
| 4,653,029 | 3/1987 | Sato | 307/530 |
| 4,780,686 | 10/1988 | Murakami et al. | 330/253 |
| 4,825,110 | 4/1989 | Yamaguchi et al. | 307/530 |
| 4,910,713 | 3/1990 | Madden et al. | 365/205 |
| 4,973,864 | 11/1990 | Nogami | 307/530 |

FOREIGN PATENT DOCUMENTS

| | | |
|---|---|---|
| 0383080 | 1/1990 | European Pat. Off. . |
| 1-55769 | 11/1989 | Japan . |

OTHER PUBLICATIONS

"A 9ns 1Mb CMOS SRAM", by Sasaki et al., 1989 IEEE International Solid State Circuits Conference, Digest of Technical Papers, Feb. 15, 1989, pp. 34-35.

"A 15ns 4Mb CMOS SRAM", by Aizaki et al., 1990 IEEE International Solid State Circuits Conference, Digest of Technical Papers, Feb. 15, 1990, pp. 126-127.

Primary Examiner—Robert J. Pascal
Assistant Examiner—Tan Dinh
Attorney, Agent, or Firm—Lowe, Price, LeBlanc & Becker

[57] ABSTRACT

An amplifier circuit of a symmetrical type is implemented with load transistors 1, 3, 5, 6 and input transistors 2, 4. Load transistors 1, 5 and input transistor 2 constitute a first inverter, and load transistors 3, 6 and input transistor 4 constitute a second inverter. A change in the output potential of each inverter is transmitted to a load transistor of the other inverter and increases the fluctuation of the potential of an output signal. A transistor 9 or 10 for current control is arranged between an input transistor and ground or between a load transistor and a power supply. The transistor 9 or 10 for current control interrupts through current when operation of the amplifier circuit is unnecessary and enhances the gain when the amplifier circuit is on operation. The gain is enhanced by setting the conductance of the load transistor and the conductance of the input transistor on predetermined conditions. Furthermore, an offset voltage caused in each amplifier circuit is canceled out by connecting two sets of symmetrical-type amplifier circuits.

13 Claims, 11 Drawing Sheets $$\begin{cases} gm5 + gm1 = gm3 + gm6 \\ \quad gm5 > gm1 \\ \quad gm3 > gm6 \\ gm2 = gm4 \end{cases}$$

$$\begin{cases} gm5 + gm1 = gm3 + gm6 \\ \quad gm5 > gm1 \\ \quad gm3 > gm6 \\ gm2 = gm4 \end{cases}$$

$(gm_5 + gm_1) : gm_2 = (gm_3 + gm_6) : gm_4$ $gm_5 + gm_1 + gm_2 \neq gm_3 + gm_6 + gm_4$ $(gm_5 + gm_1) : gm_2 = (gm_3 + gm_6) : gm_4$ $gm_5 + gm_1 + gm_2 \neq gm_3 + gm_6 + gm_4$ $$(gm_5 + gm_1) : gm_2 = (gm_3 + gm_6) : gm_4$$
$$gm_5 + gm_1 + gm_2 \neq gm_3 + gm_6 + gm_4$$

SYMMETRICAL DIFFERENTIAL AMPLIFIER CIRCUIT

BACKGROUND OF THE INVENTION

1. Field of the Invention

The present invention relates to amplifier circuits, and, more particularly, to an amplifier circuit suitable for a sense amplifier in a semiconductor memory device, for example.

2. Description of the Background Art

A sense amplifier is for amplifying a small potential difference on a bit line pair in a semiconductor memory device, and sense amplifiers having various circuit configurations having been developed so far.

FIG. 10 is a circuit diagram illustrating an example of a structure of a conventional sense amplifier disclosed in Japanese Patent Publication No. 1-55769 (1989), for example. Referring to FIG. 10, the sense amplifier includes load transistors 1, 3 and input transistors 2, 4. Each of load transistors 1, 3 is implemented with a P channel MOSFET. Each of input transistors 2, 4 is implemented with an N channel MOSFET. The source of each of load transistors 1, 3 is connected to a power supply (voltage Vcc). The drain of load transistor 1 is connected to the drain of input transistor 2, and the drain of load transistor 3 is connected to the drain of input transistor 4. Gates of load transistors 1, 3 are connected to each other and to the drain of input transistor 2. The source of each of input transistors 2, 4 is grounded. An input signal DIa is applied to the gate of input transistor 2, and an input signal DIb is applied to the gate of input transistor 4. Input signals DIa, DIb are supplied through a bit line pair, and they are complementary to each other. The sense amplifier illustrated in FIG. 10 amplifies the potential difference between input signal DIa and input signal DIb. An output terminal 7 is connected to the drain of input transistor 2. An output terminal 8 is connected to the drain of input transistor 4. An output signal DOa is obtained from output terminal 8, and an output signal DOb is obtained from output terminal 7.

Load transistor 1 and input transistor 2 constitute a first inverter. Load transistor 3 and input transistor 4 constitute a second inverter The conductance of load transistor 1 and the conductance of load transistor 3 are set to be equal, and the conductance of input transistor 2 and the conductance of input transistor 4 are set to be equal.

A current mirror-type CMOS amplifier circuit is implemented with the above-described structure.

Now, operation of the sense amplifier illustrated in FIG. 10 will be described with reference to FIGS. 11 and 12.

Referring to FIG. 11, when the voltage $V_5$ of input signal DIa and the voltage $V_6$ of input signal DIb are the same voltage Vr, the current characteristic of input transistor 2 is as represented by the solid line curve $I_2$. The current characteristic of load transistor 1 is as represented by the solid line curve $I_1$ because the drain and gate of load transistor 1 are short-circuited. The crossing point $P_0$ of the solid line curves $I_2$ and $I_1$ represents the output voltage of the first inverter, i.e. the output voltage $V_7$ of output signal DOb. The current characteristic of load transistor 3 is as represented by the solid line curve $I_3$, and the current characteristic of input transistor 4 is as represented by the solid line curve $I_4$ because the conductance of second inverter is set to be the same as the conductance of the first inverter, and the gate of load transistor 3 is connected to output terminal 7. Accordingly, the output voltage of the second inverter, i.e the output voltage $V_8$ of output signal DOa is as represented by the crossing point $P_0$ of the solid line curves $I_3$ and $I_4$, which is the same as the output voltage of the first inverter.

Next, consideration will be given to the case where complimentary signals are supplied as input to the sense amplifier illustrated in FIG. 10.

First, in the case where the voltage $V_{5a}$ of input signal DIa is $Vr+\Delta Vr$, and the voltage $V_{6a}$ of input signal DIb is $Vr-\Delta Vr$, the characteristic curves shift from the solid line curve $I_2$ to the dotted-line curve $I_{2a}$, from the solid line curve $I_3$ to the dotted-line curve $I_{3a}$, and from the solid line curve $I_4$ to the dotted-line curve $I_{4a}$. Accordingly, the crossings of these curves shift from $P_0$ to $P_1$ and $P_2$, and the output voltage of the second inverter, i.e. the output voltage $V_{8a}$ of output signal DOa, becomes a high voltage $V_H$ corresponding to the crossing point $P_2$.

Conversely, in the case where the voltage $V_{5b}$ of input signal DIa is $Vr-\Delta Vr$, and the voltage $V_{6b}$ of input signal DIb is $Vr+\Delta Vr$, the characteristic curves shift from the solid line curve $I_2$ to the dotted-line curve $I_{2b}$, from the solid line curve $I_3$ to the dotted-line curve $I_{3b}$, and from the solid line curve $I_4$ to the dotted-line curve $I_{4b}$, respectively, as illustrated in FIG. 12. Accordingly, the crossing points of these characteristic curves shift from $P_0$ to $P_3$ and $P_4$, and the output voltage of the second inverter, i.e. the output voltage $V_{8b}$ of output signal DOa becomes a low voltage $V_L$ corresponding to the crossing point $P_4$.

As described above, the potential difference $2\Delta Vr$ between input signals DIa and DIb is amplified to be $V_E-V_L$. In the sense amplifier illustrated in FIG. 10, the current flowing in the first inverter and the current flowing in the second inverter are of the same intensity. Therefore, the sense amplifier illustrated in FIG. 10 is referred to as a current mirror-type CMOS amplifier circuit.

However, the amplifier circuit illustrated in FIG. 10 has an asymmetrical structure. Therefore, in the case where complementary signals are supplied as inputs to input transistors 2, 4, change in the output voltage $V_7$ of the first inverter is extremely small as compared to change in the output voltage $V_8$ of the second inverter. Specifically, the output voltage $V_7$ of the first inverter changes only to the voltage $V_{7a}$ or $V_{7b}$. As a result, an amplified output signal can be obtained only from the second inverter side in the amplifier circuit illustrated in FIG. 10, so that there was a problem that the gain is small.

In addition, the amplifier circuit illustrated in FIG. 10 has an asymmetrical structure, so that there was a problem that the offset voltage caused by diversification of the characteristics of elements constituting the circuit or the like is transmitted intact to the circuit in the next stage.

A CMOS sense amplifier having a symmetrical structure is disclosed in U.S. Pat. No. 4,479,202 for solving various problems as described above. FIG. 13 is a circuit diagram illustrating the structure of the sense amplifier illustrated in U.S. Pat. No. 4,479,202.

The CMOS sense amplifier illustrated in FIG. 13 includes load transistors 5 and 6 added to the structure of the CMOS sense amplifier illustrated in FIG. 10.

Each of load transistors 5, 6 is implemented with a P channel MOSFET. The source of each of load transistors 5, 6 is connected to a power supply in the same manner as load transistors 1, 3. The drain of load transistor 5 is connected to the drain of input transistor 2, and the drain of load transistor 6 is connected to the drain of input transistor 4. The gates of load transistors 5, 6 are connected to each other and to the drain of input transistor 4. Load transistors 1, 5 and input transistor 2 constitute a first inverter, and load transistors 3, 6 and input transistor 4 constitute a second inverter.

Load transistors 1, 3, 5, and 6 are set to have equal conductance, and input transistors 2, 4 are also set to have equal conductance.

Now, operation of the CMOS sense amplifier illustrated in FIG. 13 will be described.

When the potentials of input signals DIa and DIb are equal, it is clear that the potentials of output signals DOa, DOb are also equal, since load transistors 1, 3, 5, and 6 have equal conductance and input transistors 2, 4 have equal conductance.

In the case where complementary input signals DIa, DIb (DIa>DIb) are applied to the gates of input transistors 2, 4, the potentials of output signals DOa, DOb are going to be changed by the functions of load-transistors 1, 3. The rise in potential of output signal DOa acts to reduce the conductivity of load transistor 5. Therefore, in the first inverter, the conductivity of input transistor 2 becomes relatively high, and the potential of output signal DOb is made lower. In addition, the fall in the potential of output signal DOb acts to increase the conductivity of load transistor 3. Consequently, the potential of output signal DOa is made higher.

In the case where the relationship between the potentials of input signals DIa, DIb applied to the gates of input transistors 2, 4 is reverse to the above-described one (DIa<DIb), an operation exactly reverse to the above-described one is carried out in the circuit, since the sense amplifier illustrated in FIG. 13 has a symmetrical structure. Specifically, the potential of output signal DOa is lowered greatly, and the potential of output signal DOb is raised greatly.

As described above, the sense amplifier illustrated in FIG. 13 has a symmetrical structure, so that fluctuation of the potentials of both output signals DOa, DOb is large. Therefore, it is possible to provide an amplifier circuit having a larger gain as compared to that of the sense amplifier illustrated in FIG. 10.

As described above, the sense amplifier illustrated in FIG. 13 has a symmetrical structure, so that it has a large gain and a small offset voltage. However, there is a danger of an undesired through current flowing from the power supply to ground when operation is unnecessary (in a period during which the sense amplifier should be rendered inactive) in the sense amplifier illustrated in FIG. 13. Specifically, in the case where one of or both of input signals DIa, DIb attain(s) a value exceeding the threshold voltage of input transistors 2, 4 for any reason when operation is unnecessary, one of or both of input transistors 2, 4 turn(s) on. This causes one or both of load transistors 1, 3 to turn on, and a current path is formed from the power supply toward ground. A through current flows in the current path. Accordingly, the problem with the amplifier circuit illustrated in FIG. 13 was that there is a danger of current flowing even when operation is unnecessary, and current consumption becomes large.

While the sense amplifier illustrated in FIG. 13 is improved so that a larger gain is obtained as compared to that of the sense amplifier illustrated in FIG. 10, there was a demand for realizing a further larger gain.

SUMMARY OF THE INVENTION

Accordingly, an object of the present invention is to provide an amplifier circuit with reduced power consumption as compared to the conventional amplifier circuits.

Another object of the present invention is to provide an amplifier circuit with a larger gain as compared to the conventional amplifier circuits.

An amplifier circuit according to an aspect of the present invention includes first and second input transistors of a first conductivity type, first to fourth load transistors of a second conductivity type, and a transistor for current control. Each of the first and second input transistors has a gate and first and second conducting terminals and receives first and second input signals at the gate. Each of the first and second load transistors has a gate and first and second conducting terminals and has the first conducting terminal connected to the first conducting terminal of the first input transistor. Each of the third and fourth load transistors has a gate and first and second conducting terminals and has the first conducting terminal connected to the first conducting terminal of the second input transistor. The transistor for current control is connected to the second conducting terminals of the first and second input transistors. The gates of the first and third load transistors are connected to each other and to the first conducting terminal of the first input transistor. The gates of the second and fourth load transistors are connected to each other and to the first conducting terminal of the second input transistor. An output signal is obtained from the first conducting terminal of each of the first and second input transistors.

An amplifier circuit according to another aspect of the present invention includes first and second input transistors and first to fourth load transistors in the same manner as the amplifier circuit according to claim 1. It further includes a transistor for current control connected to the second conducting terminals of the first to fourth load transistors.

According to the above-described two aspects of the present invention, the transistor for current control is turned off when operation of the amplifier circuit is unnecessary, so that the path of through current of the amplifier circuit is interrupted by the transistor for current control. Therefore, undesirable power consumption is reduced when operation is unnecessary. In addition, the transistor for current control functions as a constant current source when the amplifier circuit is on operation, so that the gain of the amplifier circuit is further enhanced.

An amplifier circuit according to still another aspect of the present invention includes first and second input transistors and first to fourth load transistors in the same manner as the amplifier circuit according to claim 1. The conductance of the first input transistor and that of the second input transistor are selected to be equal. The conductance of the second load transistor and that of the third load transistor are selected to be respectively larger than the conductance of the first load transistor and that of the fourth load transistor, and the sum of the conductance of the first load transistor and that of the second load transistor and the sum of the conductance of the third load transistor and that of the fourth load transistor are selected to be equal.

According to this aspect of the present invention, the conductance of the second load transistor and that of the third load transistor are selected to be respectively larger than the conductance of the first load transistor and that of the fourth load transistor, so that the changes in the conductivity of the second load transistor and that of the third load transistor are increased when complementary signals are applied as the first and second input signals. The change in the potential of an output signal is also increased according as the changes in the conductivity of the second load transistor and that of the third load transistor are increased, so that the gain of the amplifier circuit is enhanced. In addition, the conductance of the first input transistor and that of the second input transistor are selected to be equal, and the sum of the conductance of the first load transistor and that of the second load transistor and the sum of the conductance of the third load transistor and that of the fourth load transistor are selected to be equal, so that symmetry of operation of the circuit is not lost.

An amplifier circuit according to a further aspect of the present invention includes first and second input transistors and first to fourth load transistors in the same manner as the amplifier circuit according to claim 1. The ratio of the conductance of the first input transistor to the sum of the conductance of the first load transistor and that of the second load transistor and the ratio of the conductance of the second input transistor to the sum of the conductance of the third load transistor and that of the fourth load transistor are selected to be equal. In addition, the sum of the conductance of the first load transistor, that of the second load transistor, and that of the first input transistor and the sum of the third load transistor, that of the fourth load transistor, and that of the second input transistor are selected to be different values.

According to this aspect of the present invention, it is possible to reduce the current consumption and to enhance the gain in the case where an output signal is obtained only from the first conducting terminal of one of the first and second input transistors. Specifically, the current flowing in the whole of the amplifier circuit can be reduced by reducing the absolute value of the conductance of each of the transistors constituting the inverter from which no output signal is obtained. Conversely, the gain of the amplifier circuit for an output signal can be enhanced by increasing the conductance of each of the transistors constituting the inverters from which an output signal is obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
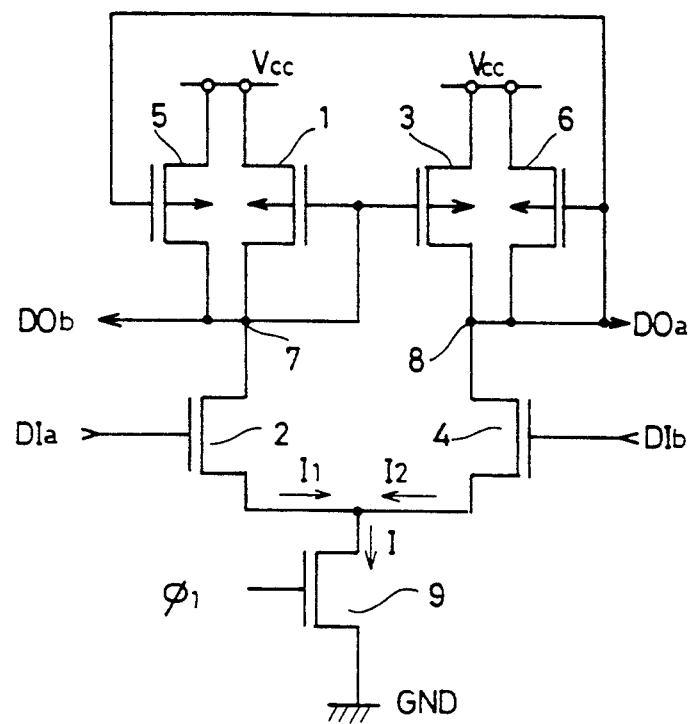
FIG. 1 is a circuit diagram illustrating a structure of a first embodiment of the present invention.

FIG. 1 is a circuit diagram illustrating a structure of a first embodiment of the present invention. The amplifier circuit according to this embodiment illustrated in FIG. 1 includes load transistors 1, 3, 5, and 6 and input transistors 2, 4 in the same manner as the conventional amplifier circuit illustrated in FIG. 13. The amplifier circuit illustrated in FIG. 1 further includes a transistor 9 for current control implemented with an N channel MOSFET. The drain of transistor 9 for current control is connected to the source of each of input transistors 2, 4. The source of transistor 9 for current control is grounded. A control signal $\phi 1$ is applied to the gate of transistor 9 for current control. Control signal $\phi 1$ attains a low or "L" level (0 V, for example) when operation of the amplifier circuit is unnecessary and attains a high or "H" level when the amplifier circuit is on operation. "H" level of control signal $\phi 1$ is selected to be a value making transistor 9 for current control operate in a saturation region. This causes transistor 9 for current control to form a constant current circuit when the amplifier circuit is on operation.

The conductance of load transistor 1, that of load transistor 3, that of load transistor 5, and that of load transistor 6 are selected to be equal, and the conductance of input transistor 2 and that of input transistor 4 are also selected to be equal.

Figure 13:
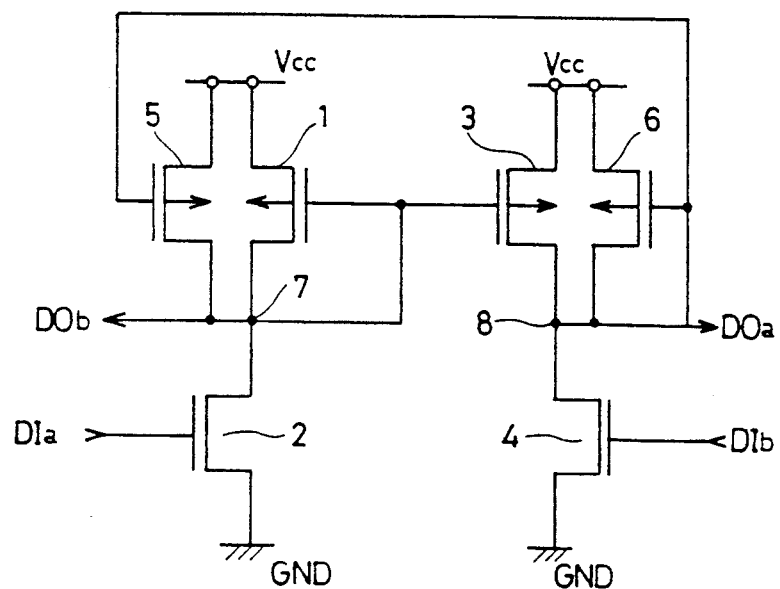
FIG. 13 is a circuit diagram illustrating a structure of another example of a conventional amplifier circuit.

According to the embodiment illustrated in FIG. 1, functions of load transistors 1, 3, 5, 6 and input transistors 2, 4 are the same as the functions of the corresponding transistors in the conventional amplifier circuit illustrated in FIG. 13. Therefore, functions and operations of transistor 9 for current control which is added in this embodiment will be intensively described in the following.

First, when operation of the amplifier circuit is unnecessary (in a standby mode, for example, in the case where the amplifier circuit is used as a sense amplifier in a semiconductor memory device, for example), the potential of control signal $\phi 1$ attains "L" level. This causes transistor 9 for current control to turn off. As a result, the path of through current flowing from the power supply to ground is interrupted by transistor 9 for current control. Accordingly, it is possible to reduce undesirable power consumption when operation is unnecessary.

Next, when the amplifier circuit is on operation (for example in a write mode, a read mode, and a refresh mode, for example, in the case where the amplifier circuit is used as a sense amplifier in a semiconductor memory device), control signal φ1 attains "H" level. As described above, "H" level of control signal φ1 is selected to be a value making transistor 9 for current control operated in a saturation region. Accordingly, transistor 9 for current control forms constant current source means when the amplifier circuit is on operation. As a result, it is possible to enhance the gain of the amplifier circuit. The reason for this will be described in the following.

As described above, making transistor 9 for current control operate in a saturation region means making transistor 9 for current control a constant current source. Therefore, in the case where I1 represents the current flowing in input transistor 2, I2 represents the current flowing in input transistor 4, and I represents the current flowing in transistor 9 for current control, the following formula (1) is realized.

$$I = I1 + I2 = constant$$

In the case where the potential of input signal DIa is lowered, for example, the -conductivity of input transistor 2 is lowered, and current I1 is reduced. According to the above formula (1), current I flowing in the transistor 9 for current control is always constant, so that if current I1 is reduced, current I2 is forced to increase. It is necessary that the source potential of input transistor 4 is lowered in order to increase current I2. It is also necessary that the drain potential of each of load transistors 3, 6 is lowered. Lowering the drain potential of each of load transistors 3, 6 causes the potential of output signal DOa to be further lowered. Specifically, the gain is enhanced. On the other hand, in the case where transistor 9 for current control is not provided as in the conventional amplifier circuit illustrated in FIG. 13, The change in input signal DIa does not affect current I2.

As described above, a change in one of the currents I1 and I2 causes a change in the other current, so that the change in the potential of an output signal is developed in the direction of increasing the gain.

Figure 2:
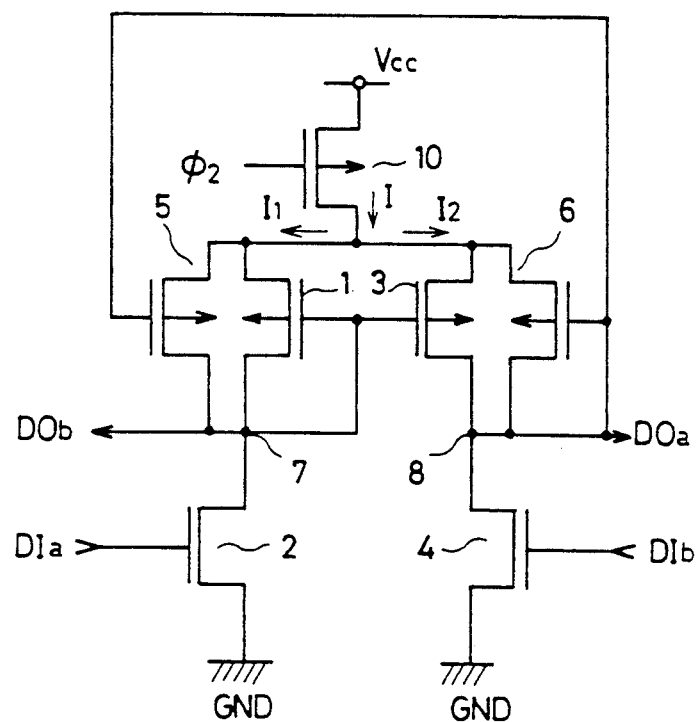
FIG. 2 is a circuit diagram illustrating a structure of a second embodiment of the present invention.

FIG. 2 is a circuit diagram illustrating a structure of a second embodiment of the present invention. The amplifier circuit according to the embodiment illustrated in FIG. 2 includes load transistors 1, 3, 5, 6 and input transistors 2, 4 in the same manner as the conventional amplifier circuit illustrated in FIG. 13. The amplifier circuit according to the embodiment illustrated in FIG. 2 further includes a transistor 10 for current control implemented with a P channel MOSFET. The source of transistor 10 for current control is connected to the power supply. The drain of transistor 10 for current control is connected to the source of each of load transistors 1, 3, 5, 6. A control signal φ2 is applied to the gate of transistor 10 for current control. Control signal φ2 attains "H" level (vcc, for example) when operation of the amplifier circuit is unnecessary and attains "L" level when it is on operation. "L" level of control signal φ2 is selected to be a sufficient value to make transistor 10 for current control operate in a saturation region. Accordingly, transistor 10 for current control serves to interrupt the path for through current when operation of the amplifier circuit is unnecessary and serves as a constant current source for enhancing the gain when the amplifier circuit is on operation in the same manner as transistor 9 for current control illustrated in FIG. 1.

The other operations of the amplifier circuit according to the embodiment illustrated in FIG. 2 are the same as the corresponding operations of the conventional amplifier circuit illustrated in FIG. 13, so that description of them will be omitted.

Figure 3:
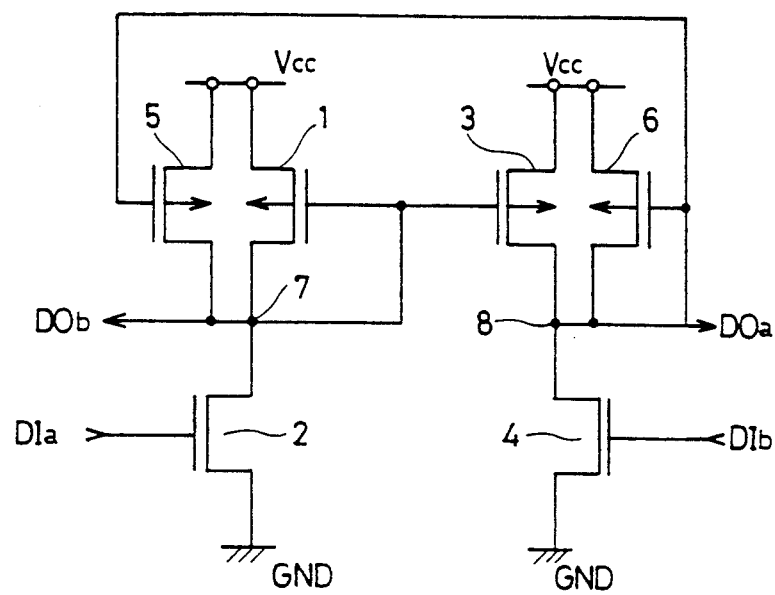
FIG. 3 is a circuit diagram illustrating a structure of a third embodiment of the present invention.

FIG. 3 is a circuit diagram illustrating a structure of a third embodiment of the present invention. The amplifier circuit illustrated in FIG. 3 includes load transistors 1, 3, 5, 6 and input transistors 2, 4 in the same manner as the conventional amplifier circuit illustrated in FIG. 13.

The embodiment illustrated in FIG. 3 is characterized by the way to select the conductance of each of the transistors. Here, conductance is the reciprocal of resistance, and the unit for it is S (siemens). Conductance is a measure for expressing the conductivity of a transistor in a quantitative manner, which is determined mainly by the channel length or the channel width. Specifically, if the channel length of the transistor is long, the conductance is lowered, and if the channel width of the transistor is large, the conductance is raised. The same conductance means that in the case where the same gate-source voltage and drain source voltage are applied to each of transistors to be compared, it is determined that the same current flows between the drain and source of each one.

According to the embodiment illustrated in FIG. 3, the conductance of each transistor is selected as described in the following. Specifically, the sum of the conductance of load transistor 5 and that of load transistor 1 and the sum of the conductance of load transistor 3 and that of load transistor 6 are selected to be equal. The conductance of load transistor 5 is selected to be larger than the conductance of load transistor 1. The conductance of load transistor 3 is selected to be larger than the conductance of load transistor 6. The conductance of input transistor 2 and that of input transistor 4 are selected to be equal. In the case where the conductance of load transistor 1, that of load transistor 3, that of load transistor 5, and that of load transistor 6 are represented by gm1, gm3, gm5, and gm6, respectively, and the conductance of input transistor 2 and that of input transistor 4 are represented by gm2 and gm4, respectively, the above-described relationship will be represented as the following formulas.

$$gm5 + gm1 = gm3 + gm6$$

$$gm5 > gm1$$

$$gm3 > gm6$$

$$gm2 = gm4$$

As described above, if the conductance of load transistor 5 and that of load transistor 3 are made respectively larger than the conductance of load transistor 1 and that of load transistor 6, the changes in the conductivity of load transistor 5 and that of load transistor 3 are increased when complementary input signals DIa, DIb are applied. Accordingly, the changes in the potentials of output signals DOa, DOb are also increased according as the changes in the conductivity of load transistor 5 and that of load transistor 3 are increased, so that the gain is enhanced.

According to the embodiment illustrated in FIG. 3, the relationship of gm5 + gm1 = gm3 + gm6 and the relationship of gm2 = gm4 are maintained, so that symmetry of operation of the circuit is secured. Specifically, symmetry of operation is secured between the first inverter implemented with load transistors 1, 5 and input transistor 2 and the second inverter implemented with load transistors 3, 6 and input transistor 4, and it is possible to prevent imbalance between the gains of output signals DOa and DOb. In the case where the potentials of input signals DIa and DIb are the same, for example, the potentials of output signals DOa and DOb are also the same.

Figure 4:
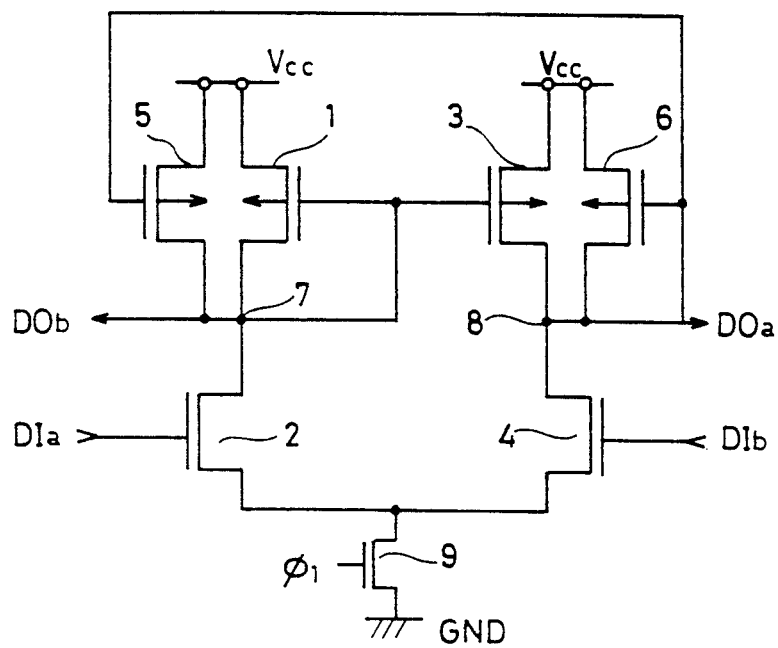
FIG. 4 is a circuit diagram illustrating a structure of a fourth embodiment of the present invention.

FIG. 4 is a circuit diagram illustrating a structure of a fourth embodiment of the present invention. According to the embodiment illustrated in FIG. 4, transistor 9 for current control is added to the structure of the amplifier circuit illustrated in FIG. 3. Transistor 9 for current control in FIG. 4 has the same functions as those of transistor 9 for current control in FIG. 1. The conductance of each of load transistors 1, 3, 5, 6 and that of each of input transistors 2, 4 are set on the same conditions. Accordingly, the embodiment illustrated in FIG. 4 brings about both the effects of the embodiment illustrated in FIG. 1 and the effects of the embodiment illustrated in FIG. 3. Specifically, undesirable through current is interrupted by transistor 9 for current control when operation of the amplifier circuit is unnecessary, and the gain is enhanced when the amplifier circuit is on operation. In addition, the gain is enhanced by setting the conductance of each transistor on the same conditions of the embodiment illustrated in FIG. 3.

Figure 5:
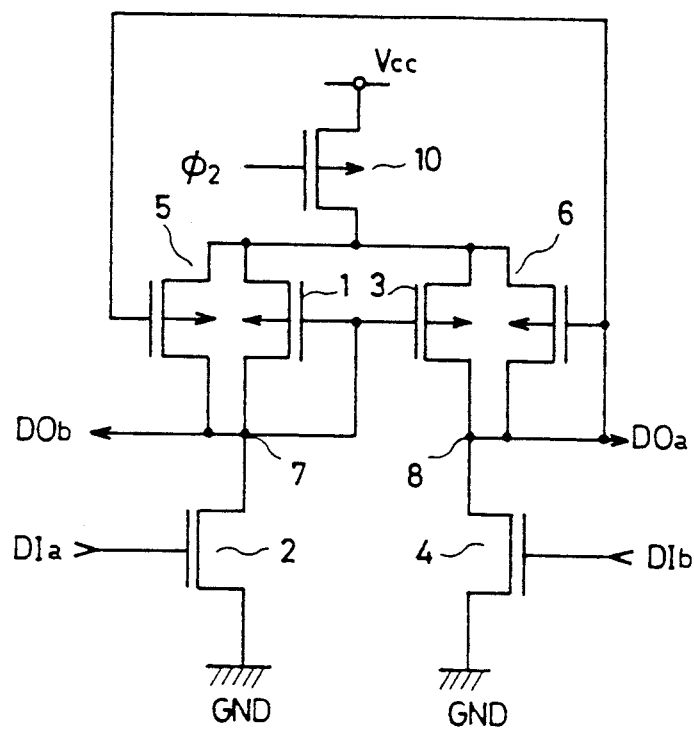
FIG. 5 is a circuit diagram illustrating a structure of a fifth embodiment of the present invention.

FIG. 5 is a circuit diagram illustrating a structure of a fifth embodiment of the present invention. According to the embodiment illustrated in FIG. 5, a transistor 10 for current control is provided in addition to the structure of the embodiment illustrated in FIG. 3. Transistor 10 for current control according to the embodiment in FIG. 5 has the same functions as those of transistor 10 for current control in FIG. 2. Specifically, transistor 10 for current control interrupt undesirable through current when operation of the amplifier circuit is unnecessary and enhances the gain by forming a constant current source when the amplifier circuit is on operation. In addition, the conductance of each of load transistors 1, 3, 5, 6 and input transistors 2, 4 is set on the same conditions as in the embodiment illustrated in FIG. 3. Accordingly, the embodiment illustrated in FIG. 5 brings about both of the effects of the embodiment illustrated in FIG. 2 and the effects of the embodiment illustrated in FIG. 3. According to the embodiment illustrated in FIG. 5, it is possible to reduce undesirable power consumption when operation of the amplifier circuit is unnecessary and to enhance the gain when the amplifier circuit is on operation.

Figure 6:
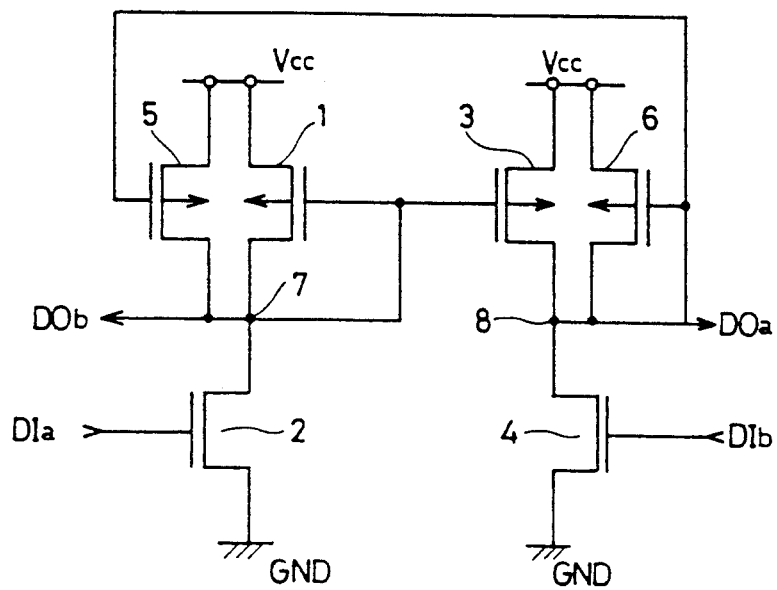
FIG. 6 is a circuit diagram illustrating a structure of a sixth embodiment of the present invention.

FIG. 6 is a circuit diagram illustrating a structure of a sixth embodiment of the present invention. The embodiment illustrated in FIG. 6 includes load transistors 1, 3, 5, 6 and input transistors 2, 4 in the same manner as the conventional amplifier circuit illustrated in FIG. 13.

The embodiment illustrated in FIG. 6 is characterized by the way to select the conductance of each transistor. Specifically, the ratio of the conductance of input transistor 2 to the sum of the conductance of load transistor 5 and that of load transistor 1 and the ratio of the conductance of input transistor 4 to the sum of the conductance of load transistor 3 and that of load transistor 6 are selected to be equal. In addition, the sum of the conductance of load transistor 5, that of load transistor 1, and that of input transistor 2 is selected to be a value different from the value of the sum of the conductance of load transistor 3, that of load transistor 6, and that of input transistor 4. Specifically, the conductance of each transistor is set as in the following formula.

$$(gm5+gm1):gm2=(gm3+gm6):gm4$$

$$gm5+gm1+gm2 \neq gm3+gm6+gm4$$

According to the embodiment illustrated in FIG. 6, the potential of output signal DOb is determined by the ratio of the resistance of load transistors 1, 5 to that of input transistor 2, and the potential of output signal DOa is determined by the ratio of the resistance of load transistors 3, 6 to that of input transistor 4. Accordingly, if the ratio of the conductance of the load transistor to that of the input transistor is the same in the first and second inverters, the absolute value of conductance does not affect operation of the amplifier circuit. Specifically, symmetry of operation of the circuit is not lost.

While it is possible to obtain two signals DOa and DOb as output signals from the amplifier circuit according to present invention, there is a case where only one of the output signals is actually obtained and utilized. For example, there is a case to be considered where only output signal DOa is utilized in the embodiment illustrated in FIG. 6. In this case, no load is connected to the first inverter implemented with load transistors 1, 5 and input transistor 2, so that the current driving capability may be small. Accordingly, the absolute values of the conductance of load transistor 1, that of load transistor 5 and the conductance of input transistor 2 may be selected to be small. This causes the current flowing in the first inverter to be small and the current flowing in the whole of the amplifier circuit to be reduced as a result, and the power consumption can be reduced. On the other hand, in the second inverter from which an output signal is obtained, the conductance of each of load transistors 3, 6 and input transistor 4 is selected to be large, so that it is possible to obtain sufficient driving capability even if a load is connected thereto.

Figure 7:
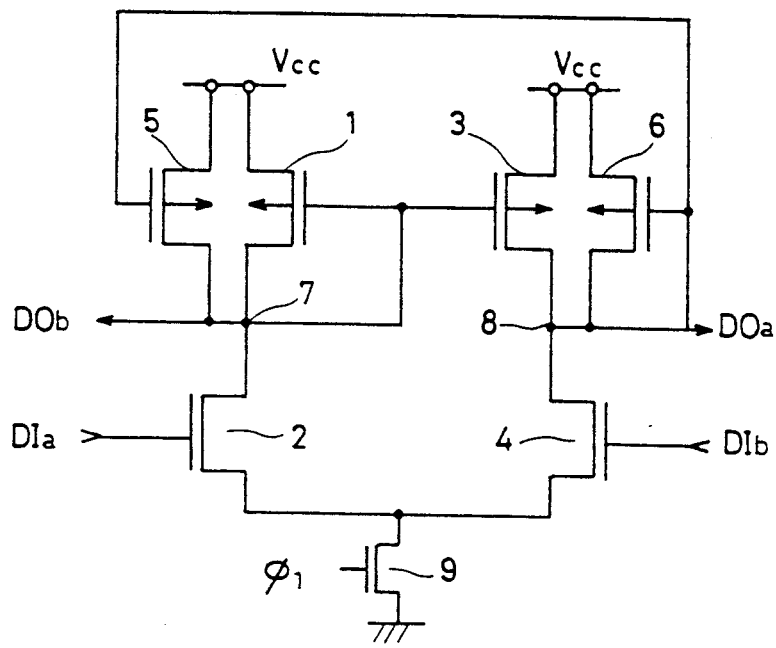
FIG. 7 is a circuit diagram illustrating a structure of a seventh embodiment of the present invention.

FIG. 7 is a circuit diagram illustrating a structure of a seventh embodiment of the present invention. According to the embodiment illustrated in FIG. 7, a transistor 9 for current control which is the same as the one in the embodiment illustrated in FIG. 1 is provided in addition to the structure of the embodiment illustrated in FIG. 6. The conductance of the load transistors and that of the input transistors are set on the same conditions as those of the embodiment illustrated in FIG. 6. Accordingly, the embodiment illustrated in FIG. 7 brings about both of the effects of the embodiment illustrated in FIG. 1 and the effects of the embodiment illustrated in FIG. 6.

Figure 8:
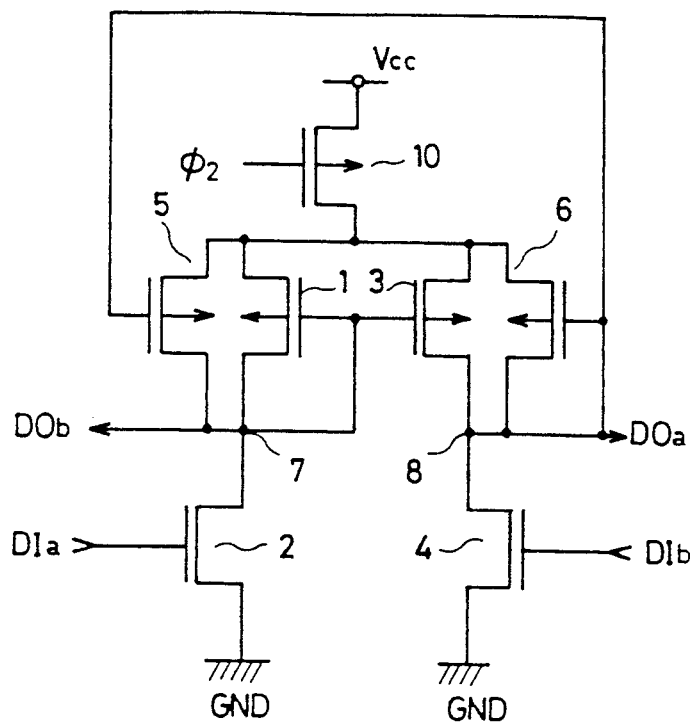
FIG. 8 is a circuit diagram illustrating a structure of a eighth embodiment of the present invention.

FIG. 8 is a circuit diagram illustrating a structure of an eighth embodiment of the present invention. According to the embodiment illustrated in FIG. 8, a transistor 10 for current control which is the same as the one in the embodiment illustrated in FIG. 2 is provided in addition to the structure of the embodiment illustrated in FIG. 6. The conductance of the load transistors and that of the input transistors are set on the same conditions as the ones in the embodiment illustrated in FIG. 6. Accordingly, the embodiment illustrated in FIG. 8 brings about both of the effects of the embodiment illustrated in FIG. 2 and the effects of the embodiment illustrated in FIG. 6.

Figure 9:
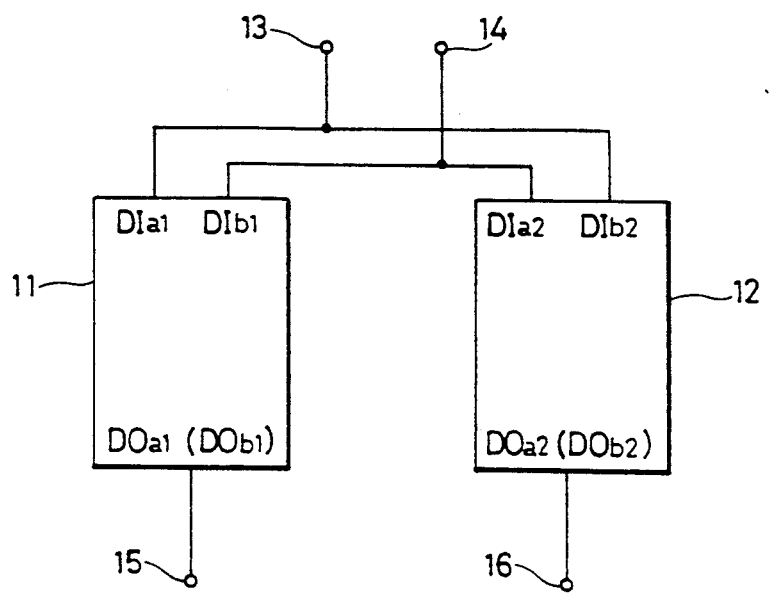
FIG. 9 is a circuit diagram illustrating a structure of a ninth embodiment of the present invention.
Figure 10:
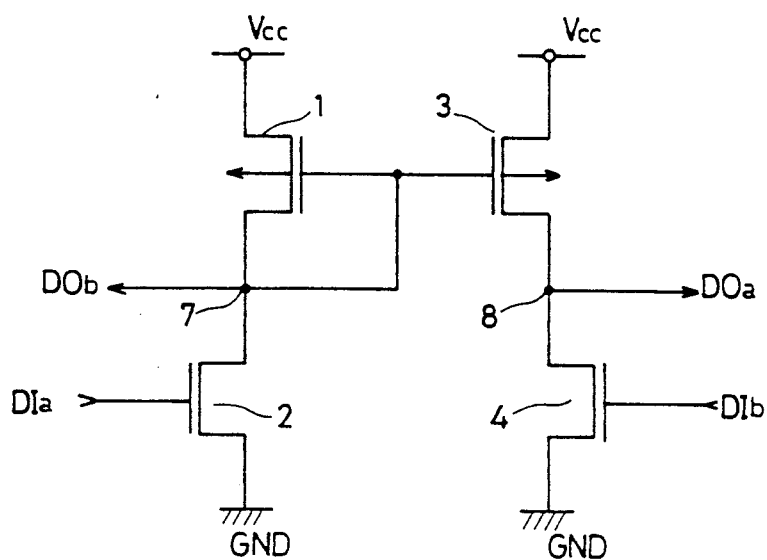
FIG. 10 is a circuit diagram illustrating an example of a structure of a conventional amplifier circuit.
Figure 11:
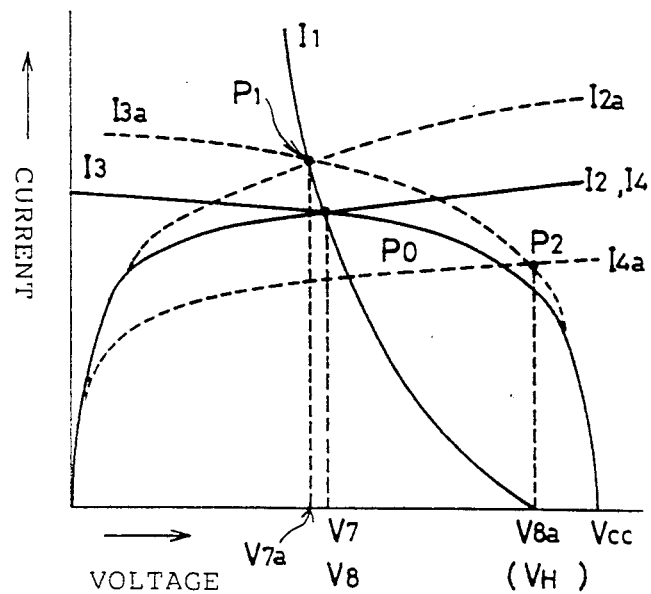
FIG. 11 is a graph for explaining operation of the conventional amplifier circuit illustrated in FIG. 10.
Figure 12:
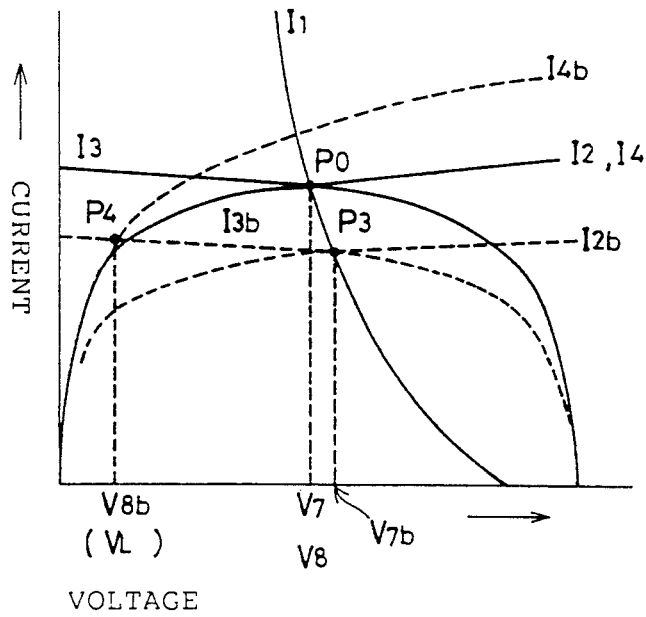
FIG. 12 is a graph for explaining operation of the conventional amplifier circuit illustrated in FIG. 10.

FIG. 9 is a block diagram illustrating a structure of a ninth embodiment of the present invention. The embodiment illustrated in FIG. 9 includes two amplifier circuits 11 and 12. Amplifier circuits 11 and 12 have the same structure. Any of the structure of the embodiments in FIGS. 1 to 8 may be used as the structure of each of amplifier circuits 11 and 12. The structure of the circuit illustrated in FIG. 13 may be also employed as the structure of each of amplifier circuits 11 and 12. A first input signal and a second input signal are applied to input terminals 13, 14, respectively. The first input signal applied to input terminal 13 is applied as an input signal DIa1 to one of the gates of input transistors 2, 4 included in amplifier circuit 11 and also applied as an input signal DIb2 to the other one of the gates of input transistors 2, 4 included in amplifier circuit 12. The second input signal applied to input terminal 14 is applied as an input signal DIb1 to the other one of the gates of input transistors 2, 4 included in amplifier circuit 11 and also applied as an input signal DIa2 to the one of the gates of input transistors 2, 4 included in amplifier circuit 12. An output terminal 15 receives an output signal DOa1 (or DOb1) from an output terminal 8 (or an output terminal 7) in amplifier circuit 11. An output terminal 16 receives an output signal DOa2 (or DOb2) from output terminal 7 (or output terminal 8) in amplifier circuit 12. Specifically, the two amplifier circuits 11, 12 are connected in a differential manner.

Now, operation in the embodiment illustrated in FIG. 9 will be described. In the case where complementary input signals are applied to the two input terminals 13, 14, the first and second input signals are applied in a crossing manner to first amplifier circuit 11 and second amplifier circuit 12, so that output signals DOa1 and DOa2 of first and second amplifier circuits 11 and 12 are signals with opposite phases.

Even if amplifier circuits 11 and 12 have offset voltages caused by diversification of the characteristics of the elements or the like, the above off set voltages are of the same value with respect to amplifier circuits 11 and 12 in the case where amplifier circuits 11, 12 are formed in the same monolithic IC. Accordingly, if output signals of opposite phases are formed using two amplifier circuits 11, 12 as illustrated in FIG. 9, it is possible to cancel out the offset voltage caused in each amplifier circuit. In the case where the amplifier circuits according to the embodiments illustrated in FIGS. 1-8 are used as amplifier circuits 11 and 12, it is also possible to obtain the effects brought about in each embodiment.

While each load transistor is implemented with a P channel MOSFET, and each input transistor is implemented with an N channel MOSFET in the embodiments described above, it is of course possible to implement each load transistor with an N channel MOSFET and to implement each input transistor with a P channel MOSFET. In addition, it is also possible to implement each of control transistors 9, 10 with a P channel MOSFET$_{13}$ or a N channel MOSFET.

The present invention can be applied not only to a sense amplifier but also to other uses.

As described above, according to the present invention, it is possible to provide an amplifier circuit having a high gain and a small power consumption.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An amplifier circuit for amplifying the potential difference between first and second input signals, comprising:

first and second input transistors of a first conductivity type each having a gate and first and second conducting terminals for receiving said first and second input signals, respectively, at the gates;

first and second load transistors of a second conductivity type each having a gate and first and second conducting terminals and having said first conducting terminal connected to said first conducting terminal of said first input transistor; and third and fourth load transistors of the second conductivity type each having a gate and first and second conducting terminals and having said first conducting terminal connected to said first conducting terminal of said second input transistor;

the gates of said first and third load transistors being connected to each other and to said first conducting terminal of said first input transistor;

the gates of said second and fourth load transistors being connected to each other and to said first conducting terminal of said second input transistor;

the conductance of said first input transistor and the conductance of said second input transistor being selected to be equal;

the conductance of said second load transistor and the conductance of said third load transistor being selected to be respectively larger than the conductance of said first load transistor and the conductance of said fourth load transistor, and the sum of the conductance of said first load transistor and the conductance of said second load transistor being selected to be equal to the sum of the conductance of said third load transistor and the conductance of said fourth load transistor; and output signals being obtained from said first conducting terminals of said first and second input transistors.

2. The amplifier circuit according to claim 1, further comprising a transistor for current control connected to said second conducting terminals of said first and second input transistors.

3. The amplifier circuit according to claim 1, further comprising a transistor for current control connected to said second conducting terminals of said first to fourth load transistors.

4. An amplifier circuit for amplifying a potential difference between first and second input signals, comprising:

first and second input transistors of a first conductivity type each having a gate and first and second conducting terminals for receiving said first and second input signals, respectively, at the gates;

first and second load transistors of a second conductivity type each having a gate and first and second conducting terminals and having said first conducting terminal connected to said first conducting terminal of said first input transistor; and third and fourth load transistors of the second conductivity type each having a gate and first and second conducting terminals and having said first conducting terminal connected to said first conducting terminal of said second input transistor;

said gates of said first and third load transistors being connected to each other and to said first conducting terminal of said first input transistor;

the gates of said second and fourth load transistors being connected to each other and to said first conducting terminal of said second input transistor;

the ratio of the conductance of said first input transistor to the sum of the conductance of said first load transistor and the conductance of said second load transistor being selected to be equal to the ratio of the conductance of said second input transistor to the sum of the conductance of said third load transistor and the conductance of said fourth load transistor, and the sum of the conductance of said first load transistor, the conductance of said second load transistor, and the conductance of said first input transistor being selected to be a value different from the value of the sum of the conductance of said first load transistor, the conductance of said fourth load transistor, and the conductance of said second input transistor; and output signals being obtained from said first conducting terminals of said first and second input transistors.

5. The amplifier circuit according to claim 4, further comprising a transistor for current control connected to said second conducting terminals of said first and second input transistors.

6. The amplifier circuit according to claim 4, further comprising a transistor for current control connected to said second conducting terminals of said first to fourth load transistors.

7. An amplifier circuit for amplifying a potential difference between first and second input signals comprising first and second amplifying means connected in a differential manner, said first and second amplifying means each comprising:

first and second input transistors of a first conductivity type each having a gate and first and second conducting terminals;

first and second load transistors of a second conductivity type each having a gate and first and second conducting terminals and having said conducting terminal connected to said first conducting terminal of said first input transistor;

third and fourth load transistors of the second conductivity type each having a gate and first and second conducting terminals and having said first conducting terminal connected to said first conducting terminal of said second input transistor;

the gates of said first and third load transistors being connected to each other and to said first conducting terminal of said first input transistor;

the gates of said second and fourth load transistors being connected to each other and to said first conducting terminal of said second input transistor;

said first input signal being applied to the gate of said first input transistor in said first amplifying means and to the gate of said second input transistor in said second amplifying means; and output signals being obtained from said first conducting terminal of one of said first and second input transistors in said first amplifying means and from said first conducting terminal of the other one of said first and second input transistors in said second amplifying means, wherein each of said first and second amplifying means further includes a transistor for current control connected to said second conducting terminals of said first to fourth load transistors.

8. An amplifier circuit for amplifying a potential difference between first and second input signals comprising first and second amplifying means connected in a differential manner, said first and second amplifying means each comprising:

first and second input transistors of a first conductivity type each having a gate and first and second conducting terminals;

first and second load transistors of a second conductivity type each having a gate and first and second conducting terminals and having said conducting terminal connected to said first conducting terminal of said first input transistor;

third and fourth load transistors of the second conductivity type each having a gate and first and second conducting terminals and having said first conducting terminal connected to said first conducting terminal of said second input transistor;

the gates of said first and third load transistors being connected to each other and to said first conducting terminal of said first input transistor;

the gates of said second and fourth load transistors being connected to each other and to said first conducting terminal of said second input transistor;

said first input signal being applied to the gate of said first input transistor in said first amplifying means and to the gate of said second input transistor in said second amplifying means; and output signals being obtained from said first conducting terminal of one of said first and second input transistors in said first amplifying means and from said first conducting terminal of the other one of said first and second input transistors in said second amplifying means, wherein the conductance of said first input transistor and the conductance of said second input transistor being selected to be equal;

the conductance of said second load transistor and the conductance of said third load transistor being selected to be respectively larger than the conductance of said first load transistor and the conductance of said fourth load transistor, and the sum of the conductance of said first load transistor and the conductance of said second load transistor being selected to be equal to the sum of the conductance of said third load transistor and the conductance of said fourth load transistor.

9. The amplifier circuit according to claim 8, wherein each of said first and second amplifying means further includes a transistor for current control connected to said second conducting terminals of said first and second input transistors.

10. The amplifier circuit according to claim 8, wherein each of said first and second amplifying means further includes a transistor for current control connected to said second conducting terminals of said first to fourth load transistors.

11. An amplifier circuit for amplifying a potential difference between first and second input signals comprising first and second amplifying means connected in a differential manner, said first and second amplifying means each comprising:

first and second input transistors of a first conductivity type each having a gate and first and second conducting terminals;

first and second load transistors of a second conductivity type each having a gate and first and second conducting terminals and having said conducting terminal connected to said first conducting terminal of said first input transistor;

third and fourth load transistors of the second conductivity type each having a gate and first and second conducting terminals and having said first conducting terminal connected to said first conducting terminal of said second input transistor;

the gates of said first and third load transistors being connected to each other and to said first conducting terminal of said first input transistor;

the gates of said second and fourth load transistors being connected to each other and to said first conducting terminal of said second input transistor;

said first input signal being applied to the gate of said first input transistor in said first amplifying means and to the gate of said second input transistor in said second amplifying means; and output signals being obtained from said first conducting terminal of one of said first and second input transistors in said first amplifying means and from said first conducting terminal of the other one of said first and second input transistors in said second amplifying means, wherein the ratio of the conductance of said first input transistor to the sum of the conductance of said first load transistor and the conductance of said second load transistor is selected to be equal to the ratio of the conductance of said second input transistor to the sum of the conductance of said third load transistor and the conductance of said fourth load transistor, and the sum of the conductance of said first load transistor, the conductance of said second load transistor, and the conductance of said first input transistor is selected to be a value different from the value of the sum of the conductance of said third load transistor, the conductance of said fourth load transistor, and the conductance of said second input transistor.

12. The amplifier circuit according to claim 11, wherein
each of said first and second amplifying means further includes a transistor for current control connected to said second conducting terminals of said first and second input transistors.

13. The amplifier circuit according to claim 14, wherein
each of said first and second amplifying means further includes a transistor for current control connected to said second conducting terminals of said first to fourth load transistors.

* * * * *